US011145763B2

(12) United States Patent
Pillarisetty et al.

(10) Patent No.: US 11,145,763 B2
(45) Date of Patent: Oct. 12, 2021

(54) VERTICAL SWITCHING DEVICE WITH SELF-ALIGNED CONTACT

(71) Applicant: Intel Corporation, Santa Clara, CA (US)

(72) Inventors: Ravi Pillarisetty, Portland, OR (US); Prashant Majhi, San Jose, CA (US); Seung Hoon Sung, Portland, OR (US); Willy Rachmady, Beaverton, OR (US); Gilbert Dewey, Hillsboro, OR (US); Abhishek A. Sharma, Hillsboro, OR (US); Brian S. Doyle, Portland, OR (US); Jack T. Kavalieros, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/649,171

(22) PCT Filed: Jan. 4, 2018

(86) PCT No.: PCT/US2018/012406
§ 371 (c)(1),
(2) Date: Mar. 20, 2020

(87) PCT Pub. No.: WO2019/135753
PCT Pub. Date: Jul. 11, 2019

(65) Prior Publication Data
US 2020/0220023 A1    Jul. 9, 2020

(51) Int. Cl.
*H01L 29/786*    (2006.01)
*H01L 21/225*    (2006.01)
(Continued)

(52) U.S. Cl.
CPC .... *H01L 29/78642* (2013.01); *H01L 21/2255* (2013.01); *H01L 25/0657* (2013.01);
(Continued)

(58) Field of Classification Search
None
See application file for complete search history.

(56) References Cited

U.S. PATENT DOCUMENTS 5,336,917 A    8/1994    Kohyama
6,191,435 B1    2/2001    Inoue
(Continued)

OTHER PUBLICATIONS

International Search Report and Written Opinion issued in corresponding International Application No. PCT/US2018/012406, dated Oct. 5, 2018, 15 pages.
(Continued)

*Primary Examiner* — Hsien Ming Lee
(74) *Attorney, Agent, or Firm* — Trop, Pruner & Hu, P.C.

(57) ABSTRACT

An embodiment includes a system comprising: a thin film transistor (TFT) comprising a source, a channel, a drain, and a gate; first, second, and third dielectric portions; wherein (a) a first vertical axis intersects the source, the channel, and the drain; (b) the first dielectric portion surrounds the source in a first plane; (c) the second dielectric portion surrounds the channel in a second plane; (d) the third dielectric surrounds the drain in a third plane; (e) a second vertical axis intersects the first, second, and third dielectric portions; (f) the source includes a first dopant, the first dielectric portion includes the first dopant, the second dielectric portion includes at least one of the first dopant and a second dopant, the drain includes the at least one of the first and second dopants, and the third dielectric portion includes the at least one of the first and second dopants.

24 Claims, 11 Drawing Sheets

(51) Int. Cl.
*H01L 25/065* (2006.01)
*H01L 27/24* (2006.01)
*H01L 29/36* (2006.01)
*H01L 29/417* (2006.01)
*H01L 29/66* (2006.01)

(52) U.S. Cl.
CPC .......... *H01L 27/2454* (2013.01); *H01L 29/36* (2013.01); *H01L 29/41783* (2013.01); *H01L 29/66666* (2013.01); *H01L 29/66742* (2013.01); *H01L 29/78618* (2013.01)

(56) References Cited

U.S. PATENT DOCUMENTS

| | | | |
|---|---|---|---|
| 7,476,893 | B2 | 1/2009 | Yang et al. |
| 9,230,985 | B1 * | 1/2016 | Wu .................. H01L 29/66742 |
| 9,613,955 | B1 | 4/2017 | Anderson et al. |
| 9,647,123 | B1 | 5/2017 | Balakrishnan et al. |
| 9,761,728 | B1 | 9/2017 | Cheng et al. |
| 10,903,333 | B2 * | 1/2021 | Cao .................... H01L 29/7786 |
| 2006/0273389 | A1 | 12/2006 | Cohen et al. |
| 2009/0298241 | A1 | 12/2009 | Wang et al. |
| 2011/0212592 | A1 * | 9/2011 | Nieh ................. H01L 21/26513 438/306 |
| 2016/0079286 | A1 | 3/2016 | Jin et al. |
| 2017/0005106 | A1 | 1/2017 | Zhang |
| 2017/0133513 | A1 | 5/2017 | Hong et al. |

OTHER PUBLICATIONS

Bocheux et al., "Doping of ZnO Nanowires Using Phosphorus Diffusion from a Spin-On Doped Glass Source," Journal of Applied Physics 115, 194302 (2014), six pages.

Peterson, "Liternature Review of Spin on Glass," Los Alamos National Laboratory, Mar. 2, 2016, pp. 1-7.

Tomioka et al., "A III-V Nanowire Channel on Silicon for High-Performance Vertical Transistors", Nature, vol. 488, pp. 189-192 (2012).

Dumé, "Nanowires Give Vertical Transistors a Boost," PhysicsWorld, Aug. 2, 2012, two pages.

"Thin-film Transistor," Wikipedia, downloaded Nov. 21, 2017, three pages.

European Patent Office, Office Action dated Jul. 7, 2021 in European Patent Application No. 18898297.9 (7 pages).

* cited by examiner

VERTICAL SWITCHING DEVICE WITH SELF-ALIGNED CONTACT

TECHNICAL FIELD

Embodiments of the invention are in the field of semiconductor devices and, in particular, thin film transistors.

BACKGROUND

A thin film transistor (TFT) may include a field effect transistor implemented using thin film technology. The thin films may include films of polycrystalline or amorphous silicon (or other thin film semiconductors) and a variety of insulating substrates. More specifically, a TFT may include a special kind of metal-oxide-semiconductor field effect transistor (MOSFET) made by depositing thin films of an active semiconductor layer as well as metallic contacts over a supporting (but relatively low-conducting or non-conducting) substrate. TFTs differ from conventional MOSFETs because the semiconductor material (and channel) of conventional MOSFETs is typically the substrate, such as a silicon wafer (instead of a thin film as is the case with a TFT).

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Figures herein may have elements with sidewalls orthogonal to a lower layer, whereas actual devices may have sloped walls that are non-orthogonal to a lower layer due to processing (e.g., etching, annealing, and the like). Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Figure 1:
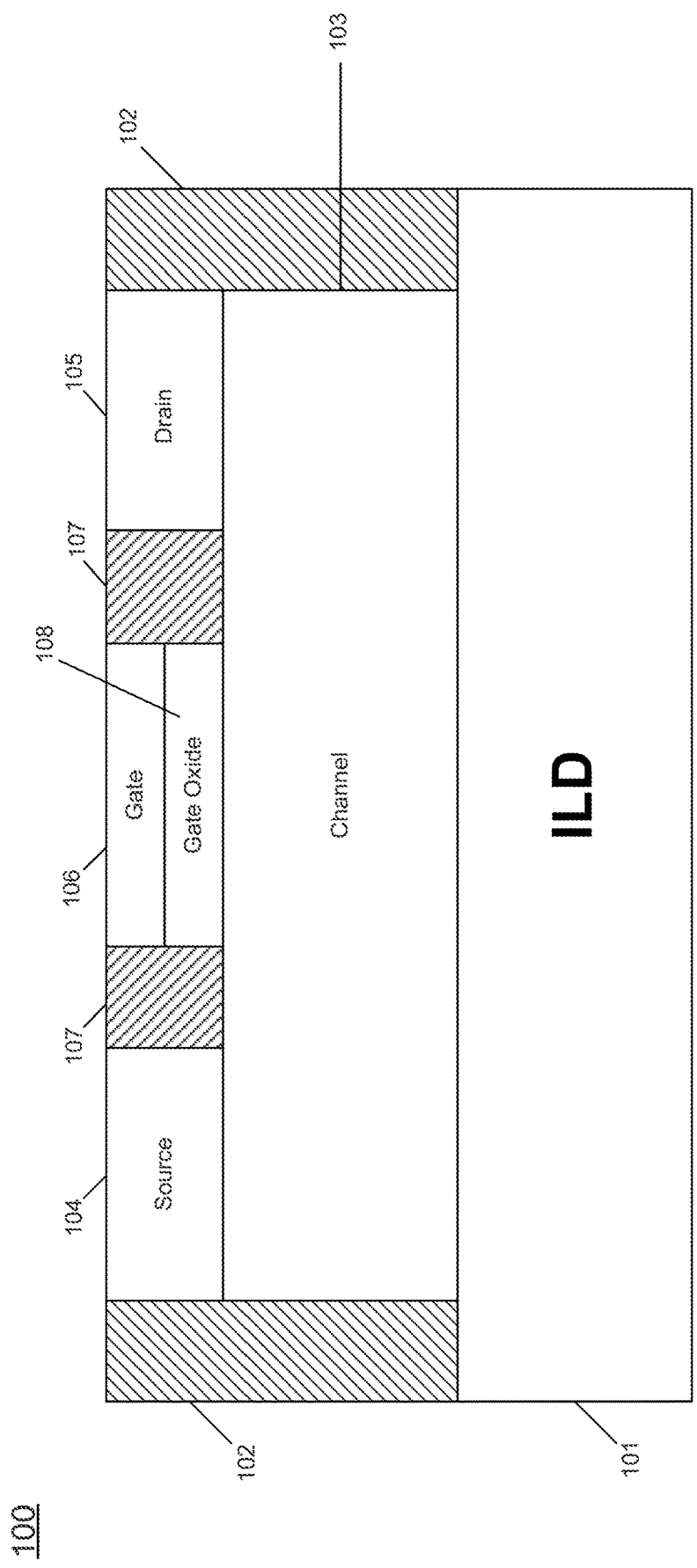
FIGS. 1 and 2 include conventional TFTs.

FIG. 1 includes a conventional TFT 100. Substrate 101 includes an inter-layer dielectric (ILD) material. A semiconductor material 103 comprising a channel is on the ILD layer. Source, drain, and gate contacts 104, 105, 106 are on the channel layer 103. The gate contact 106 is separated from the channel by gate oxide 108. Additional ILD material 102, 107 is adjacent contacts 104, 105, 106.

Figure 2:
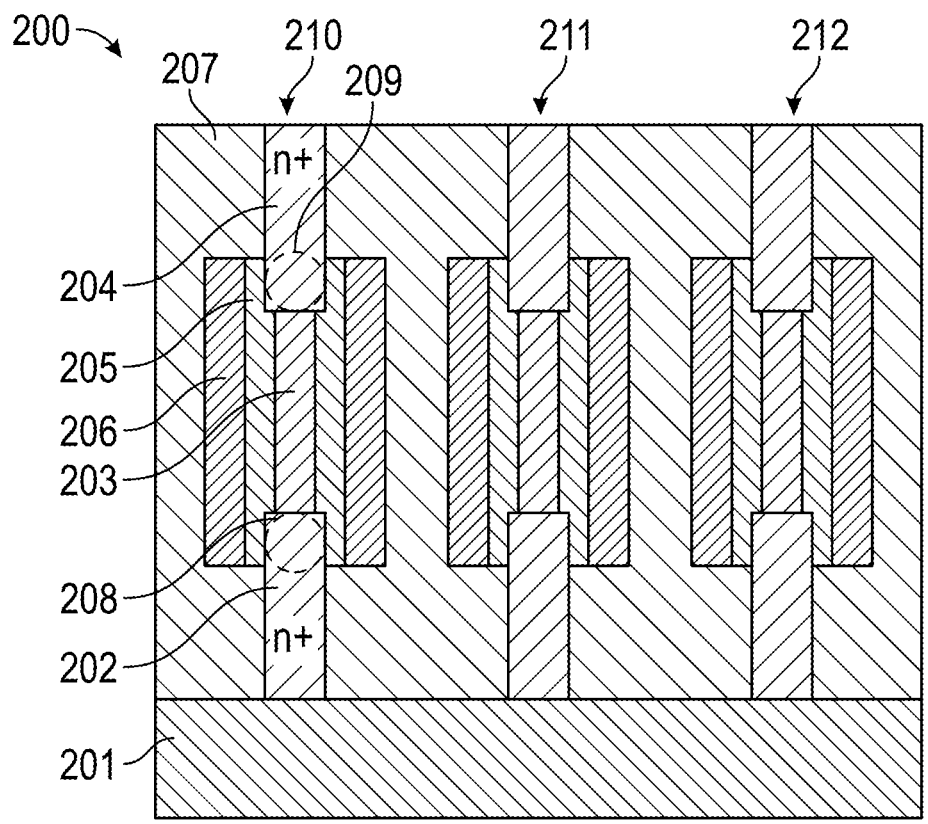

There are many methods for controlling quality for "horizontal" TFTs such as the TFT of FIG. 1. However, when TFTs are formed "vertically", as in FIG. 2—problems arise. FIG. 2 includes a vertical TFT coupled to metal layer 201. The TFT is formed in a pillar 210. The pillar includes a channel region 203 between source region 202 and drain region 204. Gate dielectric 205 and gate 206 surround channel 203. Interlayer dielectric (ILD) 207 surrounds the TFT.

Applicant determined the conventional process for forming TFT 200 is problematic. Namely, device 200 is formed by forming channel material on the metal layer 201. The bulk channel material is doped in its bottom region (where the source 202 will eventually be formed) and along the top region (where the drain 204 will eventually be formed) while leaving the middle portion (where the channel 203 will eventually be formed) undoped or less doped than the source and drain regions. Portions of the bulk material are then removed to form pillars, such as pillars 210, 211, 212. Afterwards gate dielectric 205 and gate 206 are formed. Applicant determined the formation of gate dielectric 205 and gate 206 are formed after timed etches (to form areas in ILD 207 for gate dielectric 205 and gate 206) in hopes of generally locating gate dielectric 205 and gate 206 along channel 205 (and not in the doped regions for the source and drain). However, Applicant further determined this is an imprecise manufacturing method that often results in areas of overlap between a highly doped region and gate 206. These areas of overlap are denoted as areas 208, 209. In other words, the gate is not "self-aligned" to the channel and/or source and/or drain. Applicant determined these areas of overlap result in parasitic capacitance, which adversely affects switching speed for the TFT and generally degrades performance of the TFT.

However, embodiments presented herein limit the size of overlap between TFT gates and TFT source and/or drain nodes.

Figure 3:
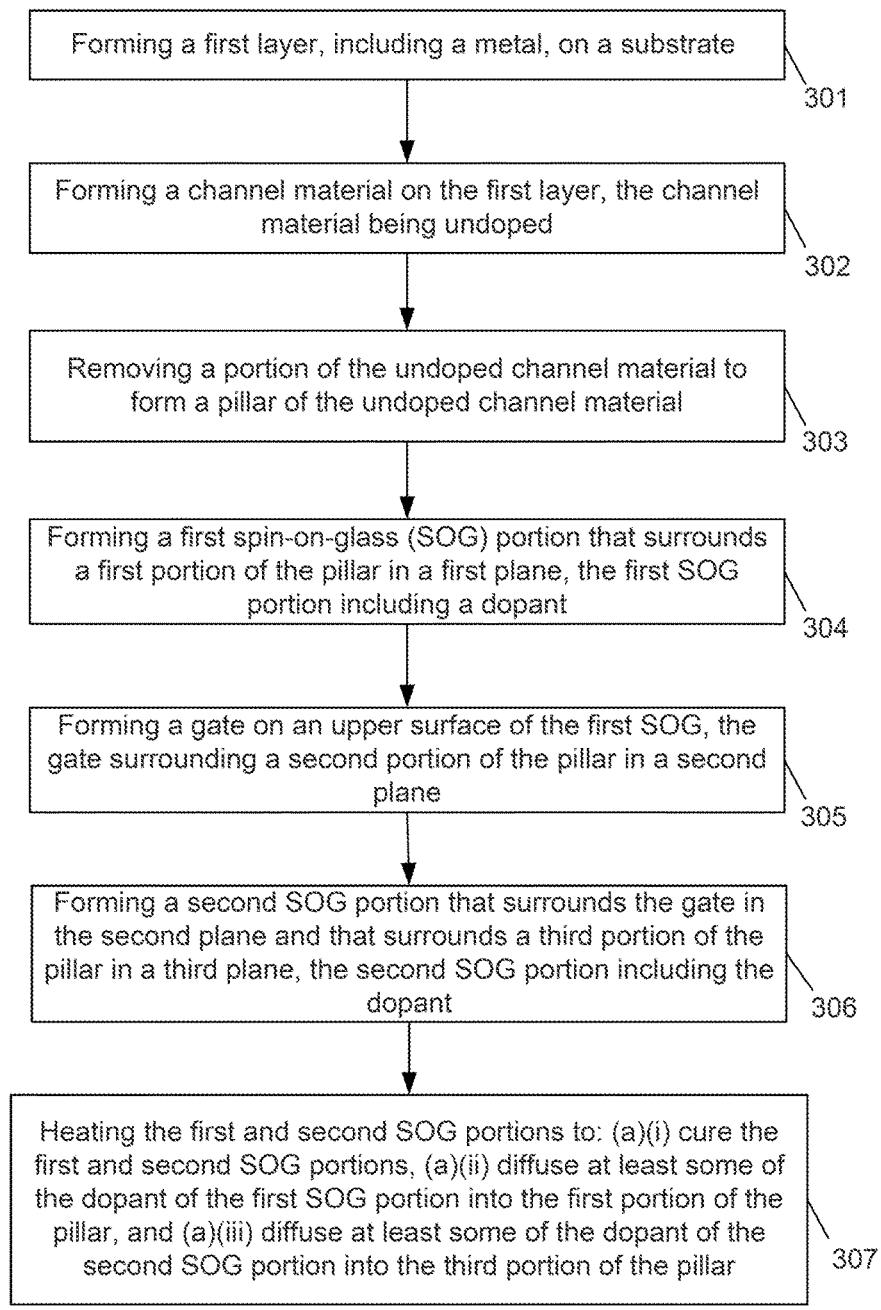
FIG. 3 includes a method of forming a TFT in an embodiment.

In FIG. 3 method 300 includes an embodiment of forming a vertical TFT. FIG. 3 and FIGS. 4A, 4B, 4C, and 4E are now discussed.

Block 301 includes forming a first layer 421, including a metal, on a substrate (not shown). Layer 421 is a "metal layer" of the "backend" of a device. Layer 421 may include copper, aluminum, and the like.

Regarding the "backend", once semiconductor wafers are prepared, a large number of process steps are still necessary to produce desired semiconductor integrated circuits. In general the steps can be grouped into four areas: Frontend Processing, Backend Processing, Test, and Packaging. Frontend and backend processing are pertinent to embodiments and are therefore described below.

Frontend processing refers to the initial steps in device fabrication. In this stage semiconductor devices (e.g., transistors) are created. A typical front end (also referred to herein as "frontend") process includes: preparation of the wafer surface (e.g., fin formation for a FinFET), patterning and subsequent implantation of dopants to obtain desired electrical properties, growth or deposition of a gate dielectric, and growth or deposition of insulating materials to isolate neighboring devices.

Once the semiconductor devices have been created they must be interconnected to form the desired electrical circuits. This "Back End Processing" (BEOL) of the back end (also referred to herein as "backend") involves depositing various layers of metal (sometimes referred to herein as M layers (see layer 421 of FIG. 4A) used to form traces, bit lines, word lines, and the like) and insulating material (sometimes referred to herein as V layers because such layers often include vias) in the desired pattern. Typically the metal layers consist of aluminum, copper, and the like. The insulating material may include $SiO_2$, low-K materials, and the like. The various metal layers are interconnected by etching holes, called "vias", in the insulating material and depositing metal (e.g., Tungsten) in them. Thus, a backend portion may include, for example, 12 metal layers: a bottom metal layer (M0), a top metal layer (M11), and a plurality of metal layers (M1, M2, M3, M4, M5, M6, M7, M8, M9, and/or M10) between the bottom and top metal layers. The "bottom metal layer" is so named because the backend portion includes no metal layer between the bottom metal layer and a top of the frontend portion. The "top metal layer" is so named because the backend portion includes no metal layer between the top metal layer and the top of the backend portion. Having 12 metal layers is just an example and backend portions may include more (e.g., 14, 16, 18, 20 or more) or less (e.g., 4, 6, 8) metal layers.

Returning to FIGS. 3 and 4A, block 302 includes forming a channel material 420 on the first layer 421, the channel material being undoped. In contrast to other techniques (e.g., FIG. 2), the doping of the channel layer occurs later in method 300.

Channel layer 420 may include zinc oxide, indium oxide, gallium oxide, indium gallium oxide, amorphous silicon, amorphous germanium, amorphous silicon germanium, polysilicon, polygermanium, poly germanium doped with boron, poly germanium doped with aluminum, poly germanium doped with phosphorous, poly germanium doped with arsenic, amorphous III-V materials, poly III-V materials, tin oxide, cupric oxide (CuO), cuprous oxide ($Cu_2O$), indium gallium zinc oxide (IGZO), IGZO with ratios 1:1:1 of each oxide, indium gallium zinc (IGZ), crystalline IGZO, amorphous IGZ, nanocrystalline IGZ, tungsten antimonide, indium antimonide, nickel oxide, cobalt oxide, indium tin oxide, tungsten disulphide, molybdenum disulphide, molybdenum selenide, black phosphorus, graphene, graphyne, borophene, germanene, silicene, Si2BN, stanene, phosphorene, molybdenite, poly-III-V (e.g., InAs, InGaAs, InP, amorphous InGaZnO (a-IGZO)), crystal (e.g., InGaZnO, (c-IGZO), GaZnON, ZnON), C-Axis Aligned Crystal (CAAC) (e.g., InGaZnO), and combinations thereof.

Block 303 includes removing a portion of the undoped channel material to form a pillar (or pillars 410, 411, 412 of FIG. 4B) (or fin) of the undoped channel material.

Block 304 includes forming a first spin-on-glass (SOG) portion 422 (FIG. 4C) that surrounds a first portion 430 of the pillar 410 in a first plane 440, the first SOG portion including a dopant. Such dopants include, for example, antimony, arsenic, phosphorous, boron, aluminum, gallium, zinc, barium, copper, gold, indium, lithium, neodymium, platinum, silver, tin, titanium, Yttrium, and combinations thereof. Thus, either N-type SOG or P-type SOG is used according to the type of TFT desired.

Block 305 includes forming a gate 406 (and gate dielectric 405) on an upper surface 423 of the first SOG 422, the gate surrounding a second portion 431 of the pillar 410 in a second plane 441.

Figure 4A:
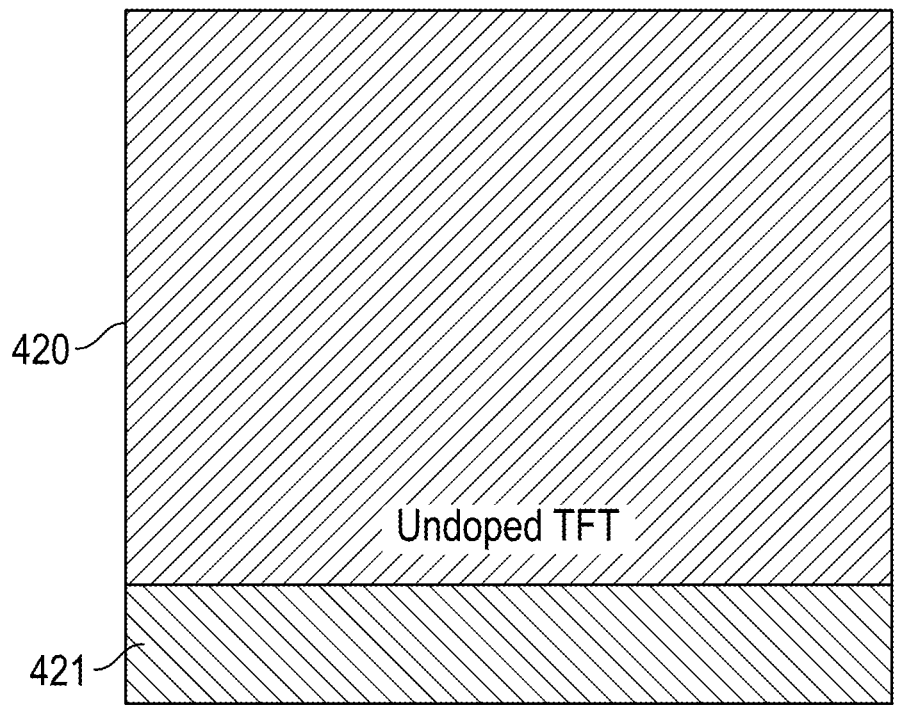
FIGS. 4A, 4B, 4C, 4D, and 4E depict a vertical TFT in an embodiment.
Figure 4B:
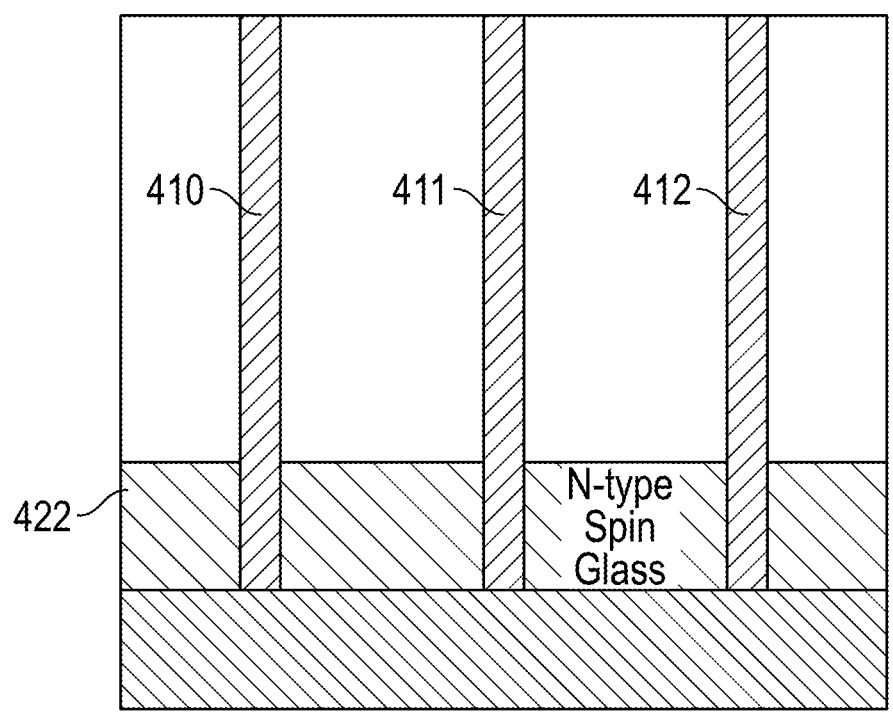
Figure 4C:
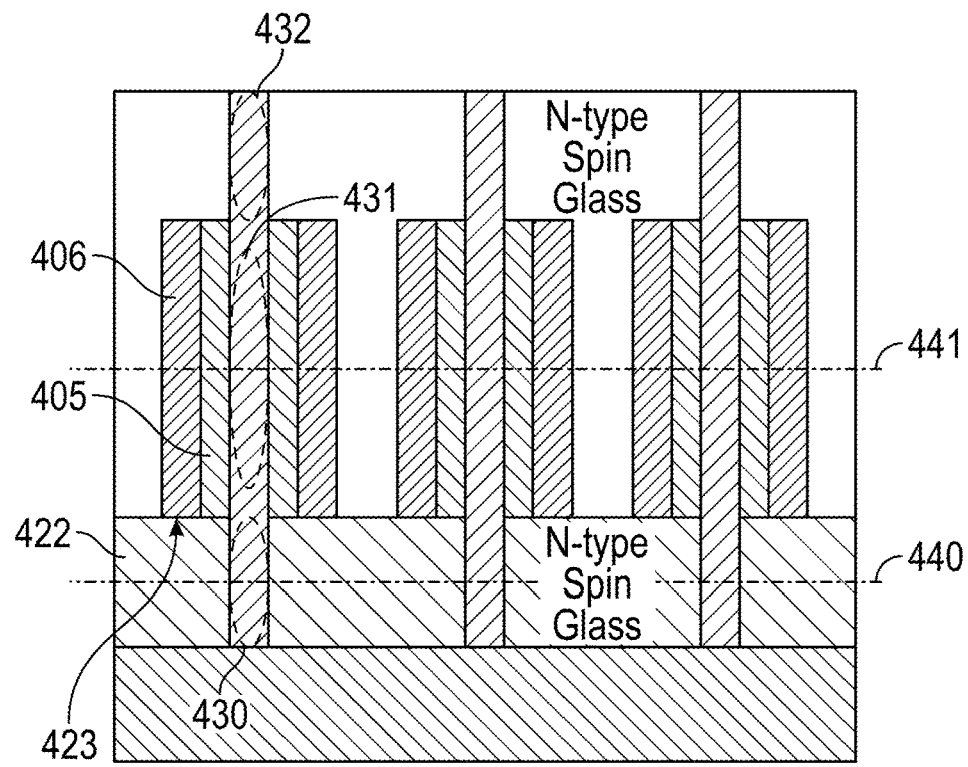
Figure 4D:
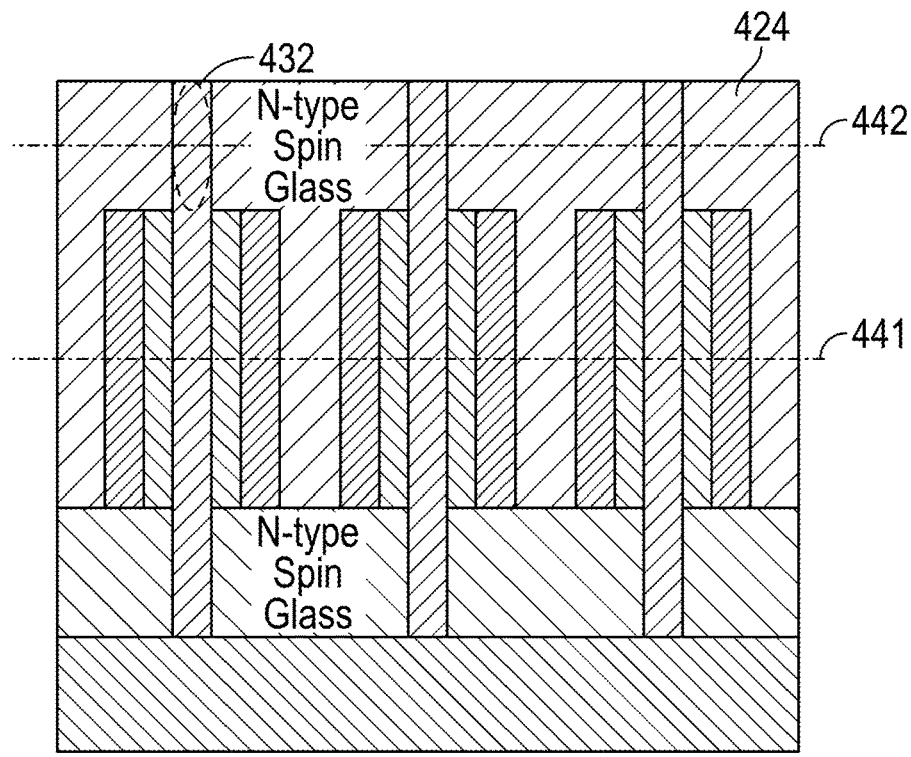

Block 306 includes forming a second SOG portion 424 (FIG. 4D) that surrounds the gate 406 in the second plane 441 and that surrounds a third portion 432 of the pillar in a third plane 442, the second SOG portion including the dopant.

Figure 4E:
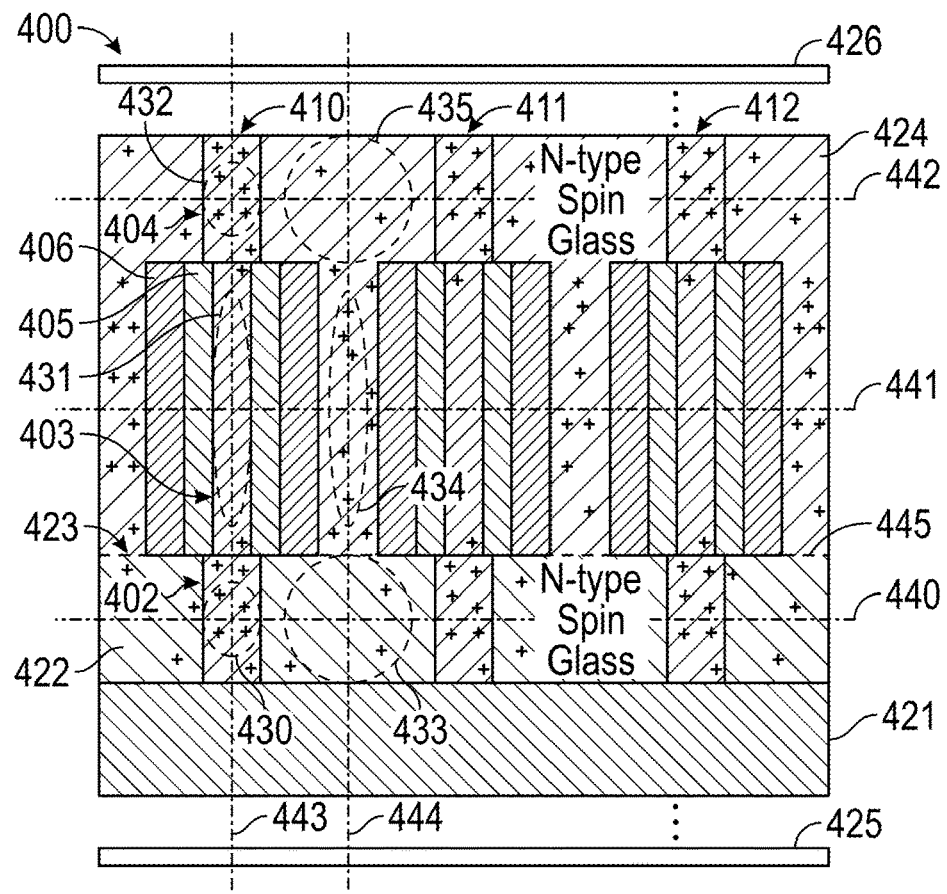

Block 307 includes heating the first and second SOG portions 422, 424 to: (a)(i) cure the first and second SOG portions, (a)(ii) diffuse at least some of the dopant of the first SOG portion into the first portion of the pillar, and (a)(iii) diffuse at least some of the dopant of the second SOG portion into the third portion of the pillar. In FIG. 4E source area 430 is now doped and drain area 432 is now doped. While in FIG. 4E the drain is above the source in other embodiments the source is above the drain.

Based on using two distinct SOG portions 422, 424, gate 406 is "self-aligned" to channel 403, source 402, drain 404. In other words, when SOG portions 422, 424 are cured their dopants diffuse to the material of pillar 410. However, since gate 406 is already formed the gate mostly shields the channel 403 from dopant diffusion to keep the channel largely undoped.

In an embodiment, the middle 80% of channel is largely undoped and therefore any doped portion of channel 403, which also overlaps (horizontally) gate 406 (analogous to portions 208, 209 of FIG. 2), is relatively small with a low concentration of dopants (relative to conventional systems such as the TFT of FIG. 2). In other embodiments the middle 75%, 85%, 95% or more of the channel is largely undoped (having a concentration of dopant that is less than 1e17 $cm^{-3}$ (while in other embodiments the doping concentration is less than 1e15 $cm^{-3}$ or less than 1e14 $cm^{-3}$ or less than 1e14 $cm^{-3}$)).

FIG. 4E will now be addressed more fully. System 400 comprises a substrate 425. This may include a device portion including CMOS transistors and the like. Layer 421 includes a metal (an M layer) on the substrate. A second layer 426 (an M layer located above M layer 421), also including the metal (e.g., copper), is on the first layer.

Pillar 410 includes a switching device between the first and second layers 421, 426. The switching device comprises a source 402, a channel 403, a drain 404, and a gate 406. System 400 further includes first, second, and third dielectric portions (subportions of which are included at 433, 434, 435). A first vertical axis 443, orthogonal to the substrate, intersects the substrate, the first layer, the second layer, the source, the channel, and the drain. The first dielectric portion (which includes subportion 433) surrounds the source 402 in a first plane 440. The second dielectric portion (which includes subportion 434) surrounds the channel 403 in a second plane 441. The third dielectric portion (which includes subportion 435) surrounds the drain 404 in a third plane 442. A second vertical axis 444 intersects the first, second, and third dielectric portions (and subportions 433,

434, 435). The first, second, and third planes 440, 441, 442 are orthogonal to the first vertical axis 443.

The source 402 includes a first dopant (e.g., a positive dopant), the first dielectric portion 433 includes the first dopant, the second dielectric portion 434 includes at least one of the first dopant and a second dopant, the drain 404 includes the at least one of the first and second dopants, and the third dielectric portion 435 includes the at least one of the first and second dopants.

The first dielectric portion 433 includes a first concentration of the first dopant (see + symbols in FIG. 4E) and the second dielectric portion 434 includes a second concentration of the at least one of the first and second dopants that is greater than the first concentration of the dopant. In other words, portion 433 may include a positive dopant and portions 434, 435 may include the same positive dopant. However in an alternative embodiment portion 433 may include a positive dopant and portions 434, 435 may include a negative dopant thereby forming a tunnel field-effect transistor (TFET) (or portion 433 may include a negative dopant and portions 434, 435 may include a positive dopant).

Regarding the dopant concentration differences, these differences occur because during the heating and curing step (i.e., the "drive in" of dopants from the SOG portions into the pillar), the SOG portion 434 diffuses fewer dopants due to the diffusion blockage provided by gate 406. Thus, along these same lines the third dielectric portion 435 includes a first concentration of the dopant and the second dielectric portion 434 includes a second concentration of the at least one of the first and second dopants that is greater than the first concentration of the dopant. As a result, FIG. 4E shows more + symbols in source and drain 402 and 404 because dopants from areas 433, 435 readily diffused into the source and drain. In so doing the number of + is less in areas 433, 435 than area 434 because area 434 was unable to diffuse dopants as readily as areas 433, 435 due to gate 406.

In an embodiment the first dielectric portion includes silicon and oxygen, the second dielectric portion includes silicon and oxygen, and the third dielectric portion includes silicon and oxygen. For example, portions may include a SOG that includes $SiO_2$. The SOG portions may include (in addition to any dopants) titanate, silica, siloxane, and the like.

The first dielectric portion 433 is included in a first dielectric layer 422; the second and third dielectric portions 434, 435 are included a second dielectric layer 424; and a seam 445 exists where the first dielectric layer interfaces the second dielectric layer (i.e., top surface 423). In other words, the first and second dielectric layers 422, 424 are not monolithic (formed as a single unit without junctions or coupling interfaces between the two) with one another.

In an embodiment upper surface 423 of the first dielectric layer directly contacts a lower surface of the gate 406.

In an embodiment at least one of the first, second, and third dielectric portions 433, 434, 435 includes air filled pores. This occurs because components of the SOG portions, such as OH or $CH_3$ groups, leave the SOG during curing. As these groups vacate the SOG they leave behind air filled pores.

An embodiment includes a plurality (e.g., array) of vertical TFTs such as the TFT of FIG. 4E. Such an embodiment would include the vertical TFT of FIG. 4E already described above in addition to similar vertical TFTs in pillars 411 and 412. The additional TFTs include channels that intersect axis 441 and further include gates that are aligned to top surface 423 to avoid overlap between the gate and source and/or drain regions and to thereby limit parasitic capacitance that can arise from such overlap.

For instance, a vertical TFT in pillar 411 (whose channel intersects axis 441) includes additional first, second, and third dielectric portions (which are immediately adjacent portions 433, 434, 435) which are closer to the gate of pillar 411 than gate 406 of pillar 410. Thus, in an embodiment the first dielectric portion 433 directly contacts the additional first dielectric portion (which is just to the right of portion 433 and to the left of the pillar 411); the second dielectric portion 434 directly contacts the additional second dielectric portion; and the third dielectric portion directly contacts the additional third dielectric portion. The dashed lines showing_boundaries for areas 433, 434, 435 are for illustrative purposes and do not limit the actual area for those dielectric portions.

The additional source includes the first dopant, the additional first dielectric portion includes the first dopant, the additional second dielectric portion includes the at least one of the first and second dopants, the additional drain includes the at least one of the first and second dopants, and the additional third dielectric portion includes the at least one of the first and second dopants. In other words, during the heating and curing of portions 433, 434, 435 other source and drain regions on other pillars also receive diffused dopants from SOG portions adjacent those source and drain regions.

In an embodiment the first dielectric portion 433 directly contacts the source 402; the second dielectric portion 434 directly contacts the gate 406; and the third dielectric portion 435 directly contacts the drain 404. This direct contact helps promote the diffusion of dopants from SOG portions into portions of pillar 410 during the curing of those SOG portions.

An embodiment comprises a memory cell and the TFT of pillar 410 serves as an access transistor corresponding to the memory cell. The memory cell may include (or be included in) a magnetic tunnel junction (MTJ), spin torque transfer random access memory (STTRAM), random access memory (RAM), dynamic random access memories (DRAMs), static random access memory (SRAM), programmable metallization cell (PMC) memory cells (also sometimes referred to as conductive bridge random access memory (CBRAM)), and the like.

In an embodiment at least one of the first and second layers (e.g., M layer 421) includes a write line corresponding to the memory cell; and at least another of the first and second layers (e.g., M layer 426) includes a bit line corresponding to the memory cell. Other M layers that may include contacts for source and/or drain nodes are not necessarily depicted in a figure but are included in the M layers of the backend portion above substrate 425.

While many embodiments described herein address pillars, such as pillar 410, other embodiments may include other structures for the vertical switching devices. For example, instead of a pillar the structure may include a fin shaped similar to fins used in FinFETs. As for the pillars, the pillar may have any of varied cross-sectional shapes such as circular, ovular, hexagonal, and the like.

While many embodiments described herein address a "gate-all-around" structure where the gate surrounds the channel in a horizontal plane, other embodiments are not so limited and may include a gate that activates the channel along one, two, or three sides (instead of four sides as is the case for the embodiment of FIG. 4E).

Figure 6:
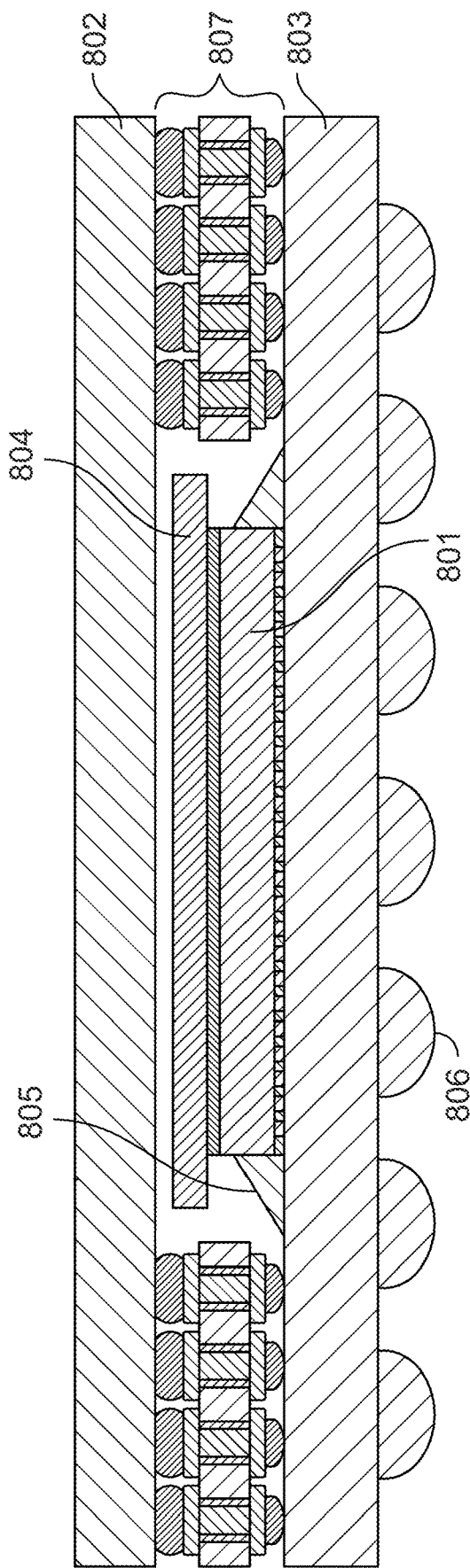
FIG. 6 depicts a package in an embodiment.

FIG. 6 includes a package system in an embodiment. The system includes a processor die 801 (a first package) on a package substrate 803. A memory die (a second package) 802 couples to the substrate 803 by way of interposer system 807. Underfill material 805 exists between die 801 and substrate 803. Substrate 803 may include controlled collapse chip connection (C4) interconnects 806. Further, to prevent warping of die 801, die 801 may couple to a metal stiffener 804. Die 801 (and/or die 802) may include a die stack (e.g., multiple dies which may have the same function or differing functions) that may be molded as one unit that functions as a single die. For example, one die of the stack may have a first logic function while another die of the stack has another logic function that differs from the first logic function.

Die 801 includes a device such as the device of FIG. 4E. In another embodiment die 802 includes a device such as the device of FIG. 4E. In an embodiment die 801 includes a device such as the device of FIG. 4E and die 802 includes a device such as the device of FIG. 4E.

In an embodiment element 804 is not a stiffener but instead is a heat spreader (or is both a stiffener and a heat spreader). A heat spreader is a heat exchanger that moves heat between a heat source and a secondary heat exchanger whose surface area and geometry are more favorable than the source. Such a spreader may be a plate made of copper, which has a high thermal conductivity. By definition, heat is "spread out" over this geometry, so that the secondary heat exchanger may be more fully utilized. This has the potential to increase the heat capacity of the total assembly.

Figure 5A:
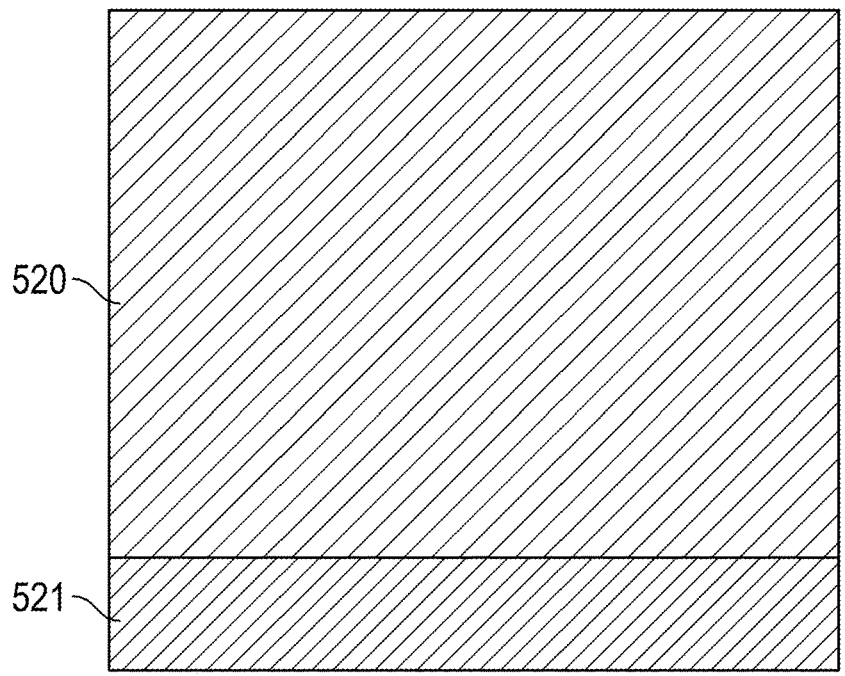
FIGS. 5A, 5B, 5C depict a vertical JFET in an embodiment.
Figure 5B:
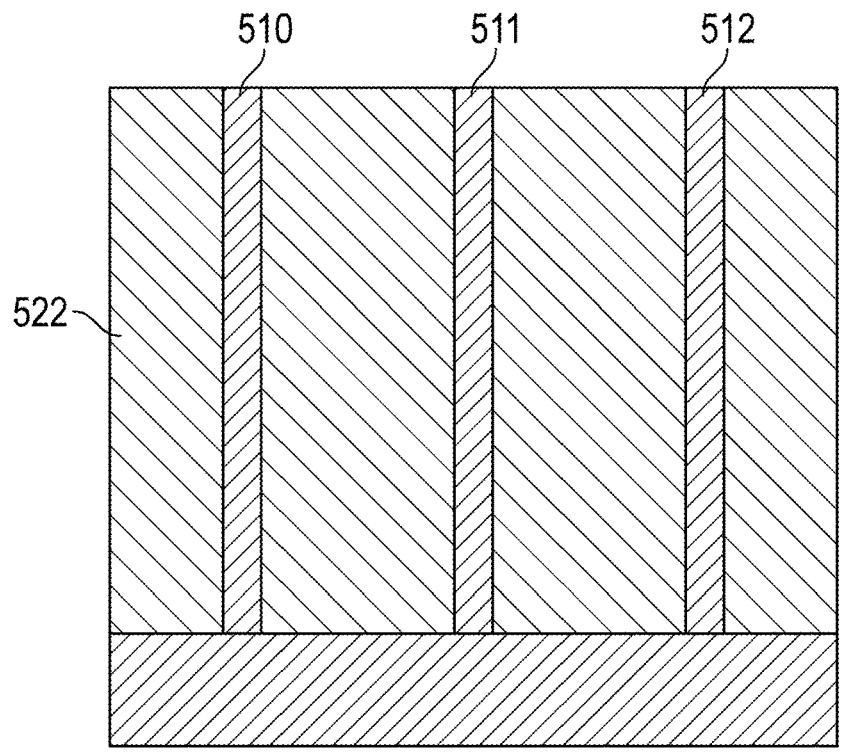
Figure 5C:
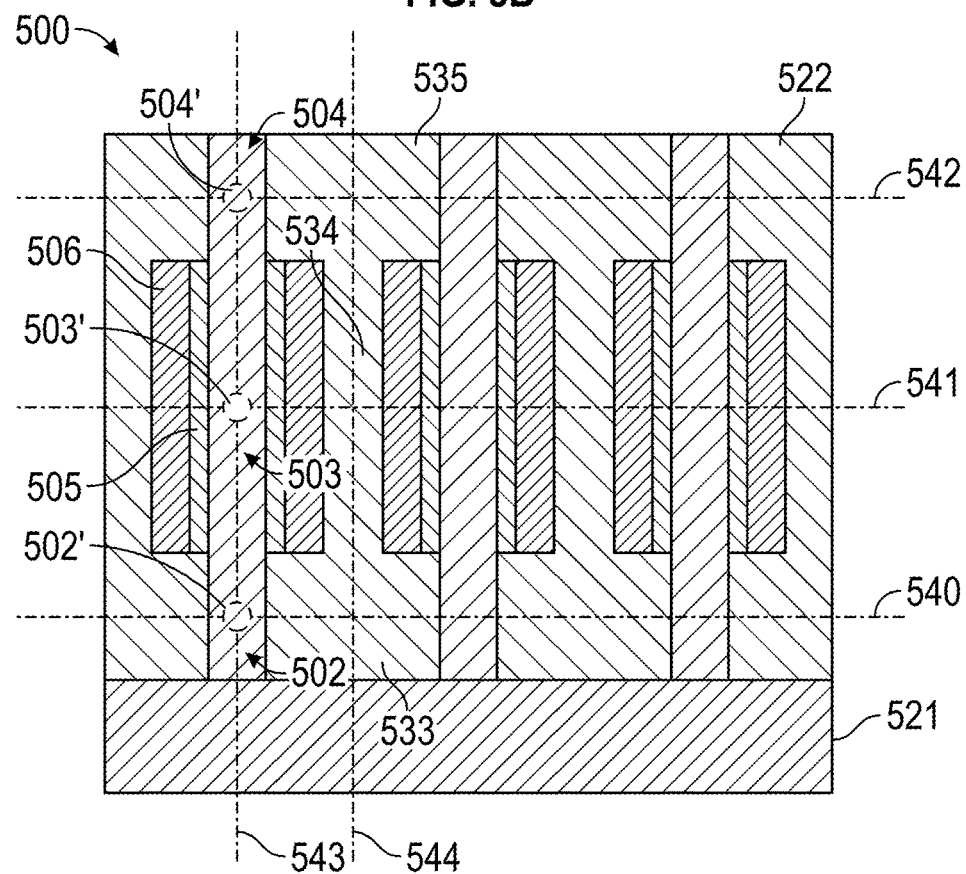

FIGS. 5A, 5B, and 5C address a method for forming a junction gate field-effect transistor (JFET). In FIG. 5A a stack of TFT material 520 is grown on a layer including metal (e.g., an M layer) 521. The TFT material is doped throughout the stack. The concentration of dopant is relatively consistent throughout the stack. The doping may be n−, n, n+, n++ (for NMOS) or p−, p, p+, p++ (for PMOS). In FIG. 5B the stack is etched to form already doped pillars 510, 511, 512. ILD 522 may be added (FIG. 5B) and then etched back to allow for creation of gate dielectric 505 and gate 506 (FIG. 5C). ILD 522 may then be reformed (FIG. 5C). Because the pillar is doped throughout its vertical length the need for precisely placing the gate at any specific location is diminished. In other words, there is no junction in the pillar (between differently doped regions) to align a gate with. Thus, the gate is "self-aligned" properly because it can be located anywhere along the pillar provided there is still room for a source and drain on the pillar. Without a junction in the pillar between differently doped regions there is also no parasitic capacitance related issues described above. Also, because the TFT stack is doped before the pillars are formed, the ILD need not be a SOG considering there is no need to diffuse dopants into the pillars from the ILD.

Thus, FIG. 5C provides a system 500 comprising: a substrate; a first layer 521, including a metal, on the substrate (not shown); a second layer (not shown), including the metal, on the first layer (an M layer located above M layer 521). A switching device (JFET) is between the first and second layers. The JFET comprises a source 502, a channel 503, a drain 504, and a gate 506. System 500 includes first, second, and third dielectric portions 533, 534, 535. A first vertical axis 543, orthogonal to the substrate, intersects the substrate, the first layer, the second layer, the source, the channel, and the drain. The first dielectric portion surrounds the source in a first plane 540; the second dielectric portion surrounds the channel in a second plane 541; and the third dielectric surrounds the drain in a third plane 542. A second vertical axis 544 intersects the first, second, and third dielectric portions. The first, second, and third planes are orthogonal to the first vertical axis. A middle portion 502' of the source includes a first dopant, a middle portion 503' of the channel includes the first dopant, and a middle portion 504' of the drain includes the first dopant.

In an embodiment the switching device is a TFT JFET. Further, the middle portion of the source 503' includes a first concentration of the first dopant, the middle portion 504' of the channel substantially includes the first concentration of the first dopant, and the middle portion 505' of the drain substantially includes the first concentration of the first dopant. Thus, the JFET pillar is substantially consistently doped throughout it source, drain, and channel.

Figure 7:
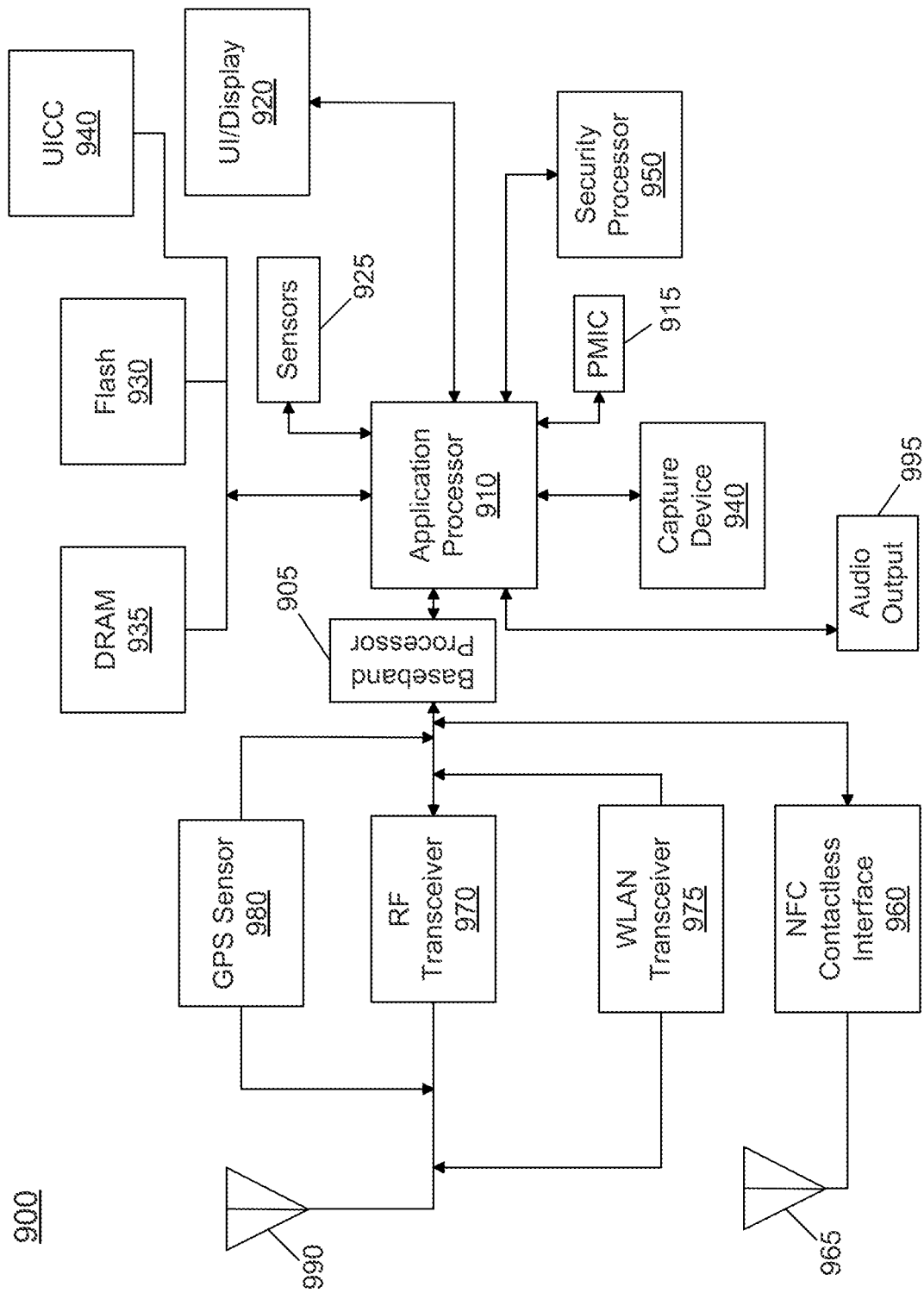
FIGS. 7, 8, and 9 include systems that include embodiments.

Referring now to FIG. 7, shown is a block diagram of an example system with which embodiments can be used. As seen, system 900 may be a smartphone or other wireless communicator or any other Internet of Things (IoT) device. A baseband processor 905 (which may be included in a package such as the package of FIG. 6 and/or may include devices such as the device of FIG. 4E or 5C) is configured to perform various signal processing with regard to communication signals to be transmitted from or received by the system. In turn, baseband processor 905 is coupled to an application processor 910 (which may be included in a package such as the package of FIG. 6 and/or may include devices such as the device of FIG. 4E or 5C), which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 (which may be included in a package such as the package of FIG. 6 and/or may include devices such as the device of FIG. 4E or 5C) and a system memory, namely a DRAM 935 (which may be included in a package such as the package of FIG. 6 and/or may include devices such as the device of FIG. 4E or 5C). In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) (which may be included in a package such as the package of FIG. 6 and/or may include devices such as the device of FIG. 4E or 5C) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may be included in a package such as the package of FIG. 6 and/or may include devices such as the device of FIG. 4E or 5C) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 8:
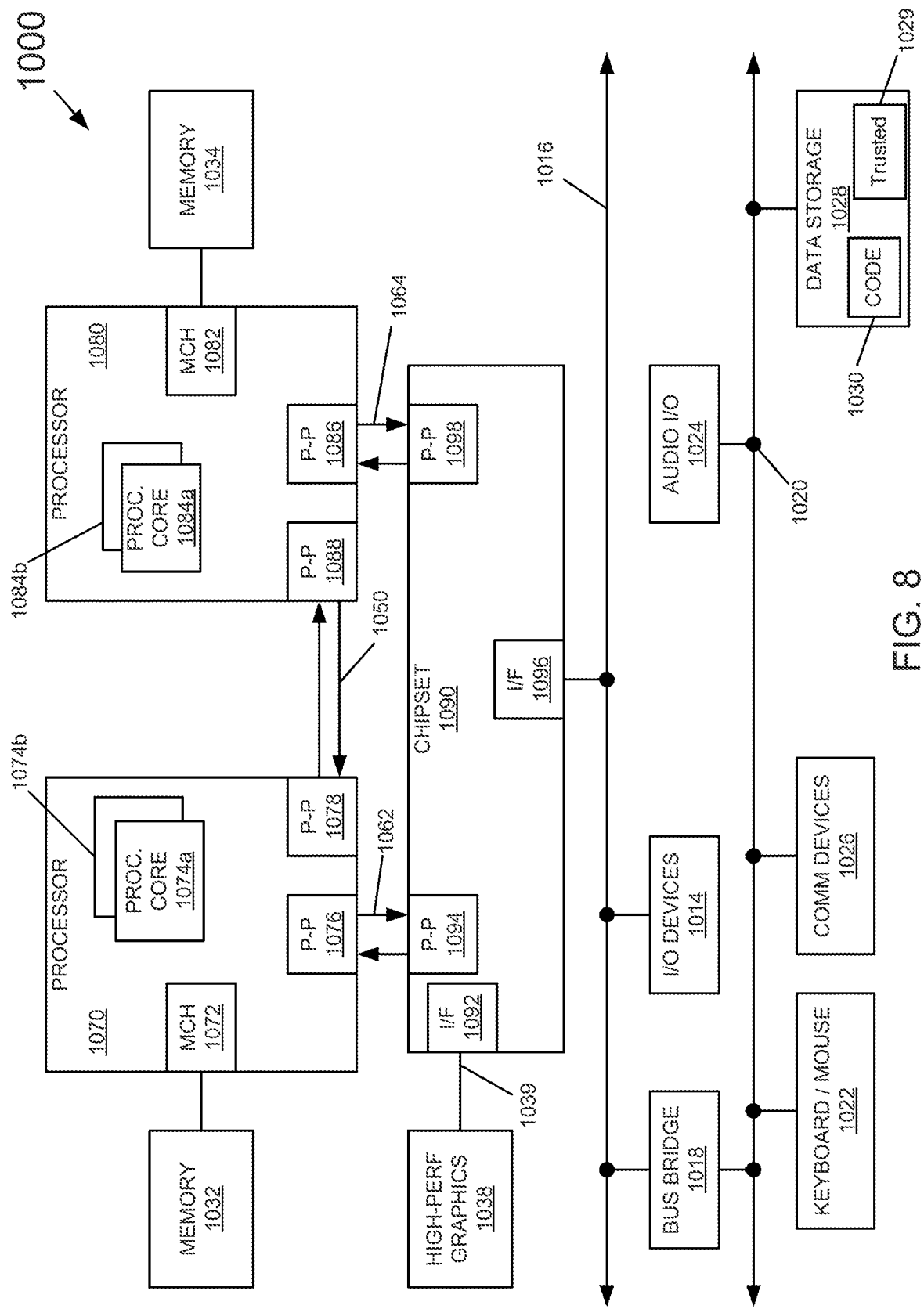

Referring now to FIG. 8, shown is a block diagram of a system in accordance with another embodiment of the present invention. Multiprocessor system 1000 is a point-to-point interconnect system such as a server system, and includes a first processor 1070 (which may be included in a package such as the package of FIG. 6 and/or may include devices such as the device of FIG. 4E or 5C) and a second processor 1080 (which may be included in a package such as the package of FIG. 6 and/or may include devices such as the device of FIG. 4E or 5C) coupled via a point-to-point interconnect 1050. Each of processors 1070 and 1080 may be multicore processors such as SoCs, including first and second processor cores (i.e., processor cores 1074*a* and 1074*b* and processor cores 1084*a* and 1084*b*), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 (which may be included in a package such as the package of FIG. 6 and/or may include devices such as the device of FIG. 4E or 5C) via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 (which may be included in a package such as the package of FIG. 6 and/or may include devices such as the device of FIG. 4E or 5C) may include code 1030, in one embodiment. As further seen, data storage unit 1028 also includes a trusted storage 1029 to store sensitive information to be protected. Further, an audio I/O 1024 may be coupled to second bus 1020.

Figure 9:
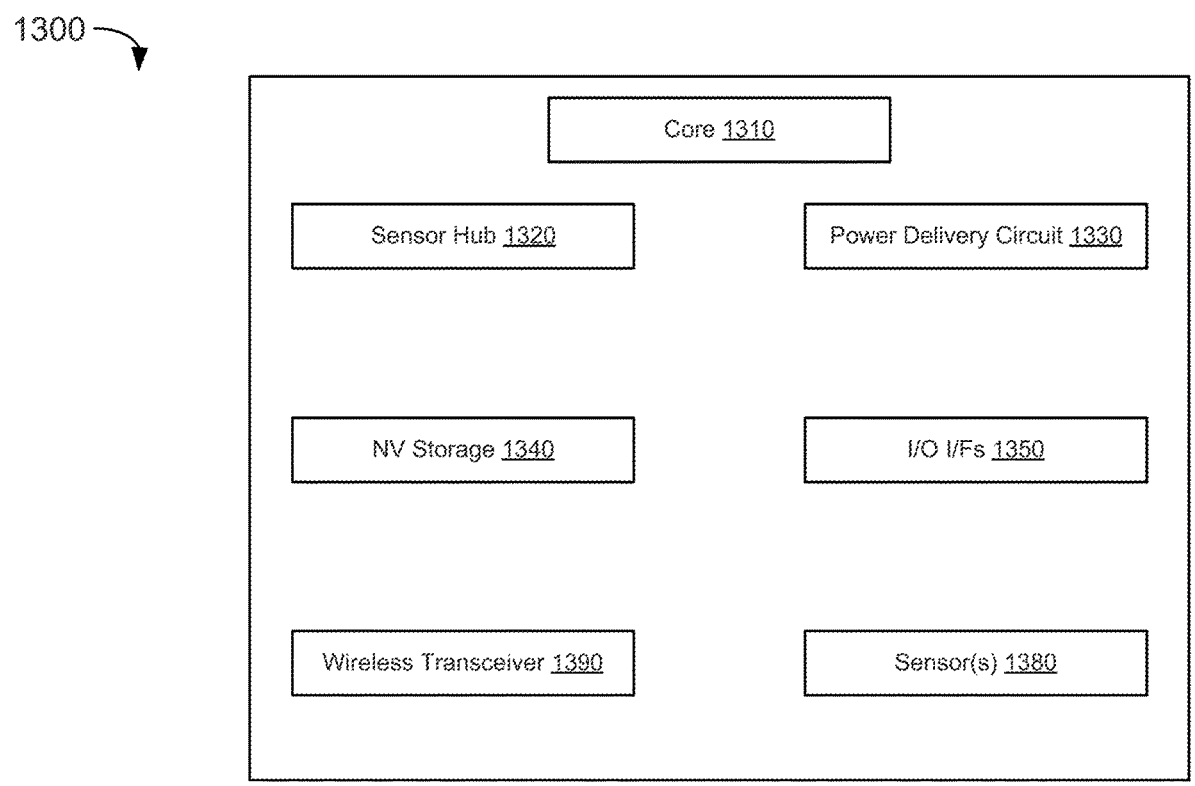

Embodiments may be used in environments where IoT devices may include wearable devices or other small form factor Internet of Things (IoT) devices. Referring now to FIG. 9, shown is a block diagram of a wearable module 1300 in accordance with another embodiment. In one particular implementation, module 1300 (which may be included in a package such as the package of FIG. 6 and/or may include devices such as the device of FIG. 4E or 5C) may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a Trusted Execution Environment (TEE). Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340. In an embodiment, this circuit may include a rechargeable battery and a recharging circuit, which may in one embodiment receive charging power wirelessly. One or more input/output (TO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1 includes a system comprising: a substrate; a first layer, including a metal, on the substrate; a second layer, including the metal, on the first layer; a switching device between the first and second layers, the switching device comprising a source, a channel, a drain, and a gate; first, second, and third dielectric portions; wherein (a) a first vertical axis, orthogonal to the substrate, intersects the substrate, the first layer, the second layer, the source, the channel, and the drain; (b) the first dielectric portion surrounds the source in a first plane; (c) the second dielectric portion surrounds the channel in a second plane; (d) the third dielectric surrounds the drain in a third plane; (e) a second vertical axis intersects the first, second, and third dielectric portions; (f) the first, second, and third planes are orthogonal to the first vertical axis, and (g) the source includes a first dopant, the first dielectric portion includes the first dopant, the second dielectric portion includes at least one of the first dopant and a second dopant, the drain includes the at least one of the first and second dopants, and the third dielectric portion includes the at least one of the first and second dopants.

Example 2 includes the system of example 1 wherein the first dielectric portion includes a first concentration of the first dopant and the second dielectric portion includes a second concentration of the at least one of the first and second dopants that is greater than the first concentration of the dopant.

Example 3 includes the system of example 1 wherein the third dielectric portion includes a first concentration of the dopant and the second dielectric portion includes a second concentration of the at least one of the first and second dopants that is greater than the first concentration of the dopant.

Example 4 includes the system of example 1 wherein the switching device includes a pillar, the pillar comprising the source, the channel, and the drain.

Example 5 includes the system of example 1 wherein the first dielectric portion includes silicon and oxygen, the second dielectric portion includes silicon and oxygen, and the third dielectric portion includes silicon and oxygen.

Embodiments of the first and second dielectric portions may include SiN or SiON.

Example 6 includes the system of example 1 wherein the second dielectric portion includes the first dopant, the drain includes the first dopant, and the third dielectric portion includes the first dopant.

Example 7 includes the system of example 1 wherein the second dielectric portion includes the second dopant, the drain includes the second dopant, the third dielectric portion includes the second dopant, the first dopant has a first polarity, and the second dopant has a second polarity opposite the first polarity.

Thus, the switching device may be a TFET.

Example 8 includes the system of example 1 wherein at least one of the first, second, and third dielectric portions includes a glass.

Example 9 includes the system of example 1 wherein at least one of the first, second, and third dielectric portions includes a spin-on-glass (SOG).

Example 10 includes the system of example 1 wherein: the first dielectric portion is included in a first dielectric layer; the second and third dielectric portions are included a second dielectric layer; and a seam exists where the first dielectric layer interfaces the second dielectric layer.

Example 11 includes the system of example 10 wherein the first and second dielectric layers are not monolithic with one another.

Example 12 include the system of example 10 wherein an upper surface of the first dielectric layer directly contacts a lower surface of the gate.

Example 13 includes the system of example 1 wherein the switching device includes a thin film transistor (TFT).

Example 14 includes the system of example 1 wherein at least one of the first, second, and third dielectric portions includes air filled pores.

In an embodiment the first dielectric portion include a greater concentration of air filled pores than the second dielectric portion.

In an embodiment the third dielectric portion include a greater concentration of air filled pores than the second dielectric portion.

Example 15 includes the system of example 1 comprising: an additional switching device between the first and second layers, the additional switching device comprising: (a)(i) an additional source, an additional channel, an additional drain, and an additional gate; and (a)(ii) additional first, second, and third dielectric portions; wherein (b) an additional first vertical axis intersects the substrate, the first layer, the second layer, the additional source, the additional channel, and the additional drain; (c) the additional first dielectric portion surrounds the additional source in the first plane; (d) the additional second dielectric portion surrounds the additional channel in the second plane; (e) the additional third dielectric surrounds the additional drain in the third plane; (f) an additional second vertical axis intersects the additional first, additional second, and additional third dielectric portions; and (g) the additional source includes the first dopant, the additional first dielectric portion includes the first dopant, the additional second dielectric portion includes the at least one of the first and second dopants, the additional drain includes the at least one of the first and second dopants, and the additional third dielectric portion includes the at least one of the first and second dopants.

Example 16 includes the system of example 15, wherein: the first dielectric portion directly contacts the additional first dielectric portion; the second dielectric portion directly contacts the additional second dielectric portion; the third dielectric portion directly contacts the additional third dielectric portion.

Example 17 includes the system of example 1 wherein: the first dielectric portion directly contacts the source; the second dielectric portion directly contacts the gate; and the third dielectric portion directly contacts the drain.

In such a case, the second dielectric portion may include an interfacial oxide (as a sublayer) that directly contacts the gate.

Example 18 includes the system of example 1 comprising a memory cell, wherein the switching device is an access transistor corresponding to the memory cell.

Example 19 includes the system of example 18 wherein: at least one of the first and second layers includes a write line corresponding to the memory cell; and at least another of the first and second layers includes a bit line corresponding to the memory cell.

Example 20 includes a system comprising: a memory; and a processor coupled to the memory, wherein at least one of the processor and the memory includes the switching device according to any one of examples 1 to 19.

Example 21 includes a package comprising: a package substrate; a first die on the package substrate; a second die on the package substrate; wherein the first die includes: an additional substrate; a first layer, including a metal, on the additional substrate; a second layer, including the metal, on the first layer; a switching device on the substrate, the switching device comprising a source, a channel, a drain, and a gate; first, second, and third dielectric portions; wherein (a) a first vertical axis, orthogonal to the additional substrate, intersects the additional substrate, the first layer, the second layer, the source, the channel, and the drain; (b) the first dielectric portion directly contacts the source; (c) the second dielectric portion directly contacts the gate; (d) the third dielectric directly contacts the drain; (e) a second vertical axis intersects the first, second, and third dielectric portions; and (f) the source includes a dopant, the first dielectric portion includes the dopant, the second dielectric portion includes the dopant, the drain includes the dopant, and the third dielectric portion includes the dopant.

Example 22 includes the package of example 21 wherein the first dielectric portion includes a first concentration of the dopant and the second dielectric portion includes a second concentration of the dopant that is greater than the first concentration of the dopant.

Example 23 includes the package of example 22 wherein: the first dielectric portion includes silicon and oxygen, the second dielectric portion includes silicon and oxygen, and the third dielectric portion includes silicon and oxygen; at least one of the first, second, and third dielectric portions includes a glass.

Example 24 includes the package according to any of example 21 comprising at least one of (a) a stiffener coupled to the first die, and (b) a heat spreader coupled to the first die.

Example 25 includes a method comprising: forming a first layer, including a metal, on a substrate; forming a channel material on the first layer, the channel material being undoped; removing a portion of the undoped channel material to form a pillar of the undoped channel material; forming a first spin-on-glass (SOG) portion that surrounds a first portion of the pillar in a first plane, the first SOG portion including a dopant; forming a gate on an upper surface of the first SOG, the gate surrounding a second portion of the pillar in a second plane; forming a second SOG portion that surrounds the gate in the second plane and that surrounds a third portion of the pillar in a third plane, the second SOG portion including the dopant; heating the first and second SOG portions to: (a)(i) cure the first and second SOG portions, (a)(ii) diffuse at least some of the dopant of the first SOG portion into the first portion of the pillar, and (a)(iii) diffuse at least some of the dopant of the second SOG portion into the third portion of the pillar; wherein (b) a first vertical axis, orthogonal to the substrate, intersects the substrate, the first layer, and the first, second, and third portions of the pillar; (b) the first, second, and third planes are parallel to each other; and (e) a second vertical axis intersects the first and second SOGs.

Example 26 includes the method of example 25 wherein: the first SOG portion includes a first concentration of the dopant; a subportion of the second SOG portion includes a second concentration of the dopant that is greater than the first concentration of the dopant; the subportion of the second SOG portion intersects the second plane; and the first SOG portion includes silicon and oxygen and the second SOG portion includes silicon and oxygen.

Example 27 includes a system comprising: a substrate; a first layer, including a metal, on the substrate; a second layer, including the metal, on the first layer; a switching device between the first and second layers, the switching device comprising a source, a channel, a drain, and a gate; first, second, and third dielectric portions; wherein (a) a first vertical axis, orthogonal to the substrate, intersects the substrate, the first layer, the second layer, the source, the channel, and the drain; (b) the first dielectric portion surrounds the source in a first plane; (c) the second dielectric portion surrounds the channel in a second plane; (d) the third dielectric surrounds the drain in a third plane; (e) a second vertical axis intersects the first, second, and third dielectric portions; (f) the first, second, and third planes are orthogonal to the first vertical axis, and (g) a middle portion of the source includes a first dopant, a middle portion of the channel includes the first dopant, and a middle portion of the drain includes the first dopant.

Other embodiments do not require that the switching device be between metal layers of the backend.

The materials of the switching device (e.g., the materials of the pillar and/or the dopants) may include the same materials described above for the embodiment of FIG. 4E).

Example 28 includes the system of example 27 wherein: the switching device includes a thin film transistor (TFT), the TFT comprising a junction gate field-effect transistor (JFET); and the middle portion of the source includes a first concentration of the first dopant, the middle portion of the channel includes the first concentration of the first dopant, and the middle portion of the drain includes the first concentration of the first dopant.

Example 1a. A system comprising: a substrate; a first layer, including a metal, on the substrate; a second layer, including the metal, on the first layer; a switching device between the first and second layers, the switching device comprising a source, a channel, a drain, and a gate; first, second, and third dielectric portions; wherein (a) a first vertical axis intersects the substrate, the first layer, the second layer, the source, the channel, and the drain; (b) the first dielectric portion surrounds the source in a first plane; (c) the second dielectric portion surrounds the channel in a second plane; (d) the third dielectric surrounds the drain in a third plane; (e) a second vertical axis intersects the first, second, and third dielectric portions; (f) the first, second, and third planes are orthogonal to the first vertical axis, and (g) the source includes a first dopant, the first dielectric portion includes the first dopant, the second dielectric portion includes at least one of the first dopant and a second dopant, the drain includes the at least one of the first and second dopants, and the third dielectric portion includes the at least one of the first and second dopants.

Example 2a. The system of example 1a wherein: the first dielectric portion includes a first concentration of the first dopant; the second dielectric portion includes a second concentration of the at least one of the first and second dopants; the second concentration is greater than the first concentration.

Example 3a. The system of example 1a wherein: the third dielectric portion includes a first concentration of the dopant; the second dielectric portion includes a second concentration of the at least one of the first and second dopants; the second concentration is greater than the first concentration.

Example 4a. The system of example 1a wherein the switching device includes a pillar, the pillar comprising the source, the channel, and the drain.

Example 5a. The system of example 1a wherein the first dielectric portion includes silicon and oxygen, the second dielectric portion includes silicon and oxygen, and the third dielectric portion includes silicon and oxygen.

Example 6a. The system of example 1a wherein the second dielectric portion includes the first dopant, the drain includes the first dopant, and the third dielectric portion includes the first dopant.

Example 7a. The system of example 1a wherein the second dielectric portion includes the second dopant, the drain includes the second dopant, the third dielectric portion includes the second dopant, the first dopant has a first polarity, and the second dopant has a second polarity opposite the first polarity.

Example 8a. The system of example 1a wherein at least one of the first, second, and third dielectric portions includes a glass.

Example 9a. The system of example 1a wherein at least one of the first, second, and third dielectric portions includes a spin-on-glass (SOG).

Example 10a. The system of example 1a wherein: the first dielectric portion is included in a first dielectric layer; the second and third dielectric portions are included a second dielectric layer; and a seam exists where the first dielectric layer interfaces the second dielectric layer.

Example 11a. The system of example 10a wherein the first and second dielectric layers are not monolithic with one another.

Example 12a. The system of example 10a wherein an upper surface of the first dielectric layer directly contacts a lower surface of the gate.

Example 13a. The system of example 1a wherein the switching device includes a thin film transistor (TFT).

Example 14a. The system of example 1a wherein at least one of the first, second, and third dielectric portions includes air filled pores.

Example 15a. The system of example 1a comprising: an additional switching device between the first and second layers, the additional switching device comprising: (a)(i) an additional source, an additional channel, an additional drain, and an additional gate; and (a)(ii) additional first, second, and third dielectric portions; wherein (b) an additional first vertical axis, orthogonal to the substrate, intersects the substrate, the first layer, the second layer, the additional source, the additional channel, and the additional drain; (c) the additional first dielectric portion surrounds the additional source in the first plane; (d) the additional second dielectric portion surrounds the additional channel in the second plane; (e) the additional third dielectric surrounds the additional drain in the third plane; (f) an additional second vertical axis intersects the additional first, additional second, and additional third dielectric portions; and (g) the additional source includes the first dopant, the additional first dielectric portion includes the first dopant, the additional second dielectric portion includes the at least one of the first and second dopants, the additional drain includes the at least one of the first and second dopants, and the additional third dielectric portion includes the at least one of the first and second dopants.

Example 16a The system of example 15a, wherein: the first dielectric portion directly contacts the additional first dielectric portion; the second dielectric portion directly contacts the additional second dielectric portion; the third dielectric portion directly contacts the additional third dielectric portion.

Example 17a. The system of example 1a wherein: the first dielectric portion directly contacts the source; the second dielectric portion directly contacts the gate; and the third dielectric portion directly contacts the drain.

Example 18a. The system of example 1a comprising a memory cell, wherein the switching device is an access transistor corresponding to the memory cell.

Example 19a. The system of example 18a wherein: at least one of the first and second layers includes a write line corresponding to the memory cell; and at least another of the first and second layers includes a bit line corresponding to the memory cell.

Example 20a. A system comprising: a memory; and a processor coupled to the memory, wherein at least one of the processor and the memory includes the switching device according to any one of examples 1a to 19a.

Example 21a. A package comprising: a package substrate; a first die on the package substrate; a second die on the package substrate; wherein the first die includes: an additional substrate; a first layer, including a metal, on the additional substrate; a second layer, including the metal, on the first layer; a switching device on the substrate, the switching device comprising a source, a channel, a drain, and a gate; first, second, and third dielectric portions; wherein (a) a first vertical axis intersects the additional substrate, the first layer, the second layer, the source, the channel, and the drain; (b) the first dielectric portion directly contacts the source; (c) the second dielectric portion directly contacts the gate; (d) the third dielectric directly contacts the drain; (e) a second vertical axis intersects the first, second, and third dielectric portions; and (f) the source includes a dopant, the first dielectric portion includes the dopant, the second dielectric portion includes the dopant, the drain includes the dopant, and the third dielectric portion includes the dopant.

Example 22a. The package of example 21a wherein: the first dielectric portion includes a first concentration of the dopant; the second dielectric portion includes a second concentration of the dopant; the second concentration is greater than the first concentration.

Example 23a. The package of example 22a wherein: the first dielectric portion includes silicon and oxygen, the second dielectric portion includes silicon and oxygen, and the third dielectric portion includes silicon and oxygen; at least one of the first, second, and third dielectric portions includes a glass.

Example 24a. The package according to any of example 21a comprising at least one of (a) a stiffener coupled to the first die, and (b) a heat spreader coupled to the first die.

Example 25a. A method comprising: forming a first layer, including a metal, on a substrate; forming a channel material on the first layer, the channel material being undoped; removing a portion of the undoped channel material to form a pillar of the undoped channel material; forming a first spin-on-glass (SOG) portion that surrounds a first portion of the pillar in a first plane, the first SOG portion including a dopant; forming a gate on an upper surface of the first SOG, the gate surrounding a second portion of the pillar in a second plane; forming a second SOG portion that surrounds the gate in the second plane and that surrounds a third portion of the pillar in a third plane, the second SOG portion including the dopant; heating the first and second SOG portions to: (a)(i) cure the first and second SOG portions, (a)(ii) diffuse at least some of the dopant of the first SOG portion into the first portion of the pillar, and (a)(iii) diffuse at least some of the dopant of the second SOG portion into the third portion of the pillar; wherein (b) a first vertical axis intersects the substrate, the first layer, and the first, second, and third portions of the pillar; (b) the first, second, and third planes are parallel to each other; and (e) a second vertical axis intersects the first and second SOGs.

Example 26a. The method of example 25a wherein: the first SOG portion includes a first concentration of the dopant; a subportion of the second SOG portion includes a second concentration of the dopant that is greater than the first concentration of the dopant; the subportion of the second SOG portion intersects the second plane; and the first SOG portion includes silicon and oxygen and the second SOG portion includes silicon and oxygen.

Example 27a. A system comprising: a substrate; a first layer, including a metal, on the substrate; a second layer, including the metal, on the first layer; a switching device between the first and second layers, the switching device comprising a source, a channel, a drain, and a gate; first, second, and third dielectric portions; wherein (a) a first vertical axis, orthogonal to the substrate, intersects the substrate, the first layer, the second layer, the source, the channel, and the drain; (b) the first dielectric portion surrounds the source in a first plane; (c) the second dielectric portion surrounds the channel in a second plane; (d) the third dielectric surrounds the drain in a third plane; (e) a second vertical axis intersects the first, second, and third dielectric portions; (f) the first, second, and third planes are orthogonal to the first vertical axis, and (g) a middle portion of the source includes a first dopant, a middle portion of the channel includes the first dopant, and a middle portion of the drain includes the first dopant.

Example 28a. The system of example 27a wherein: the switching device includes a thin film transistor (TFT), the TFT comprising a junction gate field-effect transistor (JFET); and the middle portion of the source includes a first concentration of the first dopant, the middle portion of the channel includes the first concentration of the first dopant, and the middle portion of the drain includes the first concentration of the first dopant.

Example 1b. A system comprising: a substrate; a first layer, including a metal, on the substrate; a second layer, including the metal, on the first layer; a switching device between the first and second layers, the switching device comprising a source, a channel, a drain, and a gate; first, second, and third dielectric portions; wherein (a) a first vertical axis intersects the substrate, the first layer, the second layer, the source, the channel, and the drain; (b) the first dielectric portion surrounds the source in a first plane; (c) the second dielectric portion surrounds the channel in a second plane; (d) the third dielectric surrounds the drain in a third plane; (e) a second vertical axis intersects the first, second, and third dielectric portions; (f) the first, second, and third planes are orthogonal to the first vertical axis, and (g) the source includes a first dopant, the first dielectric portion includes the first dopant, the second dielectric portion includes at least one of the first dopant and a second dopant, the drain includes the at least one of the first and second dopants, and the third dielectric portion includes the at least one of the first and second dopants.

Another version of Example 1b includes an integrated circuit device comprising: a substrate; a first layer on the substrate, the first layer including a metal; a second layer on the first layer, the second layer including the metal; a switching device between the first and second layers, the switching device comprising a source, a channel, a drain, and a gate; and first, second, and third dielectric portions; wherein (a) a first vertical axis intersects the substrate, the first layer, the second layer, the source, the channel, and the drain; (b) the first dielectric portion surrounds the source in a first plane; (c) the second dielectric portion surrounds the channel in a second plane; (d) the third dielectric portion surrounds the drain in a third plane; (e) a second vertical axis intersects the first, second, and third dielectric portions; (f) the first, second, and third planes are orthogonal to the first vertical axis, and (g) the source includes a first dopant, the first dielectric portion includes the first dopant, the second dielectric portion includes at least one of the first dopant and a second dopant, the drain includes the at least one of the first and second dopants, and the third dielectric portion includes the at least one of the first and second dopants.

Another version of example 4b includes an integrated circuit device comprising: a substrate; a first layer on the substrate, the first layer including a metal; a second layer on the first layer, the second layer including the metal; a switching device between the first and second layers, the switching device comprising a source, a channel, a drain, and a gate; and the integrated circuit device further comprising first, second, and third dielectric portions; wherein (a) a first vertical axis intersects the substrate, the first layer, the second layer, the source, the channel, and the drain; (b) the first dielectric portion surrounds the source in a first plane; (c) the second dielectric portion surrounds the channel in a second plane; (d) the third dielectric portion surrounds the drain in a third plane; (e) a second vertical axis intersects the first, second, and third dielectric portions; (f) the first, second, and third planes are orthogonal to the first vertical axis, and (g) the source includes a first dopant, the first dielectric portion includes the first dopant, the second dielectric portion includes at least one of the first dopant and a second dopant, the drain includes the at least one of the first and second dopants, and the third dielectric portion includes the at least one of the first and second dopants.

Example 2b. The integrated circuit device of example 1b wherein: the first dielectric portion includes a first concentration of the first dopant; the second dielectric portion includes a second concentration of the at least one of the first and second dopants; the second concentration is greater than the first concentration.

Example 3b. The integrated circuit device according to any of examples 1b-2b wherein: the third dielectric portion includes a first concentration of the dopant; the second dielectric portion includes a second concentration of the at least one of the first and second dopants; the second concentration is greater than the first concentration.

Example 4b. The integrated circuit device according to any of examples 1b-3b wherein the switching device includes a pillar, the pillar comprising the source, the channel, and the drain.

Example 5b. The integrated circuit device according to any of examples 1b-4b wherein the first dielectric portion includes silicon and oxygen, the second dielectric portion includes silicon and oxygen, and the third dielectric portion includes silicon and oxygen.

Example 6b. The integrated circuit device according to any of examples 1b-5b wherein the second dielectric portion includes the first dopant, the drain includes the first dopant, and the third dielectric portion includes the first dopant.

Example 7b. The integrated circuit device according to any of examples 1b-5b wherein the second dielectric portion includes the second dopant, the drain includes the second dopant, the third dielectric portion includes the second dopant, the first dopant has a first polarity, and the second dopant has a second polarity opposite the first polarity.

Example 8b. The integrated circuit device according to any of examples 1b-7b wherein at least one of the first, second, and third dielectric portions includes a glass.

Example 9b. The integrated circuit device according to any of examples 1b-7b wherein at least one of the first, second, and third dielectric portions includes a spin-on-glass (SOG).

Example 10b. The integrated circuit device according to any of examples 1b-9b wherein: the first dielectric portion is included in a first dielectric layer; the second and third dielectric portions are included a second dielectric layer; and a seam exists where the first dielectric layer interfaces the second dielectric layer.

Example 11b. The integrated circuit device of example 10b wherein the first and second dielectric layers are not monolithic with one another.

Example 12b. The integrated circuit device according to any of examples 1b-11b wherein an upper surface of the first dielectric layer directly contacts a lower surface of the gate.

Example 13b. The integrated circuit device according to any of examples 1b-12b wherein the switching device includes a thin film transistor (TFT).

Example 14b. The integrated circuit device according to any of examples 1b-13b wherein at least one of the first, second, and third dielectric portions includes air filled pores.

Example 15b. The integrated circuit device according to any of examples 1b-14b comprising: an additional switching device between the first and second layers, the additional switching device comprising: (a)(i) an additional source, an additional channel, an additional drain, and an additional gate; and (a)(ii) additional first, second, and third dielectric portions; wherein (b) an additional first vertical axis, orthogonal to the substrate, intersects the substrate, the first layer, the second layer, the additional source, the additional channel, and the additional drain; (c) the additional first dielectric portion surrounds the additional source in the first plane; (d) the additional second dielectric portion surrounds the additional channel in the second plane; (e) the additional third dielectric portion surrounds the additional drain in the third plane; (f) an additional second vertical axis intersects the additional first, additional second, and additional third dielectric portions; and (g) the additional source includes the first dopant, the additional first dielectric portion includes the first dopant, the additional second dielectric portion includes the at least one of the first and second dopants, the additional drain includes the at least one of the first and second dopants, and the additional third dielectric portion includes the at least one of the first and second dopants.

Example 16b. The integrated circuit device of example 15b, wherein: the first dielectric portion directly contacts the additional first dielectric portion; the second dielectric portion directly contacts the additional second dielectric portion; the third dielectric portion directly contacts the additional third dielectric portion.

Example 17b. The integrated circuit device according to any of examples 1b-15b wherein: the first dielectric portion directly contacts the source; the second dielectric portion directly contacts the gate; and the third dielectric portion directly contacts the drain.

Example 18b. The integrated circuit device according to any of examples 1b-17b comprising a memory cell, wherein the switching device is an access transistor corresponding to the memory cell.

Example 19b. The integrated circuit device of example 18b wherein: at least one of the first and second layers includes a write line corresponding to the memory cell; and at least another of the first and second layers includes a bit line corresponding to the memory cell.

Example 20b. A system comprising: a memory; and a processor coupled to the memory, wherein at least one of the processor and the memory includes the switching device according to any one of examples 1b to 19b.

Example 21b. A package comprising: a package substrate; a first die on the package substrate; a second die on the package substrate; wherein the first die includes: an additional substrate; a first layer, including a metal, on the additional substrate; a second layer, including the metal, on the first layer; a switching device on the substrate, the switching device comprising a source, a channel, a drain, and a gate; first, second, and third dielectric portions; wherein (a) a first vertical axis intersects the additional substrate, the first layer, the second layer, the source, the channel, and the drain; (b) the first dielectric portion directly contacts the source; (c) the second dielectric portion directly contacts the gate; (d) the third dielectric portion directly contacts the drain; (e) a second vertical axis intersects the first, second, and third dielectric portions; and (f) the source includes a dopant, the first dielectric portion includes the dopant, the second dielectric portion includes the dopant, the drain includes the dopant, and the third dielectric portion includes the dopant.

Another version of Example 21b includes A package comprising: a package substrate; a first die on the package substrate; a second die on the package substrate; wherein the first die includes: an additional substrate; a first layer on the additional substrate, the first layer include a metal; a second layer on the first layer, the second layer including the metal; a switching device on the substrate, the switching device comprising a source, a channel, a drain, and a gate; first, second, and third dielectric portions; wherein (a) a first vertical axis intersects the additional substrate, the first layer, the second layer, the source, the channel, and the drain; (b) the first dielectric portion directly contacts the source; (c) the second dielectric portion directly contacts the gate; (d) the third dielectric portion directly contacts the drain; (e) a second vertical axis intersects the first, second, and third dielectric portions; and (f) the source includes a dopant, the first dielectric portion includes the dopant, the second dielectric portion includes the dopant, the drain includes the dopant, and the third dielectric portion includes the dopant.

Example 22b. The package of example 21b wherein: the first dielectric portion includes a first concentration of the dopant; the second dielectric portion includes a second concentration of the dopant; the second concentration is greater than the first concentration.

Example 23b. The package according to any of examples 21b-22b wherein: the first dielectric portion includes silicon and oxygen, the second dielectric portion includes silicon and oxygen, and the third dielectric portion includes silicon and oxygen; at least one of the first, second, and third dielectric portions includes a glass.

Example 24b. The package according to any of examples 21b-23b comprising at least one of (a) a stiffener coupled to the first die, and (b) a heat spreader coupled to the first die.

Example 25b. A method comprising: forming a first layer, including a metal, on a substrate; forming a channel material on the first layer, the channel material being undoped; removing a portion of the undoped channel material to form a pillar of the undoped channel material; forming a first spin-on-glass (SOG) portion that surrounds a first portion of the pillar in a first plane, the first SOG portion including a dopant; forming a gate on an upper surface of the first SOG, the gate surrounding a second portion of the pillar in a second plane; forming a second SOG portion that surrounds the gate in the second plane and that surrounds a third portion of the pillar in a third plane, the second SOG portion including the dopant; heating the first and second SOG portions to: (a)(i) cure the first and second SOG portions, (a)(ii) diffuse at least some of the dopant of the first SOG portion into the first portion of the pillar, and (a)(iii) diffuse at least some of the dopant of the second SOG portion into the third portion of the pillar; wherein (b) a first vertical axis intersects the substrate, the first layer, and the first, second, and third portions of the pillar; (b) the first, second, and third planes are parallel to each other; and (e) a second vertical axis intersects the first and second SOGs.

Example 26b. The method of example 25b wherein: the first SOG portion includes a first concentration of the dopant; a subportion of the second SOG portion includes a second concentration of the dopant that is greater than the first concentration of the dopant; the subportion of the second SOG portion intersects the second plane; and the first SOG portion includes silicon and oxygen and the second SOG portion includes silicon and oxygen.

Example 27b. A system comprising: a substrate; a first layer, including a metal, on the substrate; a second layer, including the metal, on the first layer; a switching device between the first and second layers, the switching device comprising a source, a channel, a drain, and a gate; first, second, and third dielectric portions; wherein (a) a first vertical axis, orthogonal to the substrate, intersects the substrate, the first layer, the second layer, the source, the channel, and the drain; (b) the first dielectric portion surrounds the source in a first plane; (c) the second dielectric portion surrounds the channel in a second plane; (d) the third dielectric surrounds the drain in a third plane; (e) a second vertical axis intersects the first, second, and third dielectric portions; (f) the first, second, and third planes are orthogonal to the first vertical axis, and (g) a middle portion of the source includes a first dopant, a middle portion of the channel includes the first dopant, and a middle portion of the drain includes the first dopant.

Example 28b. The system of example 27b wherein: the switching device includes a thin film transistor (TFT), the TFT comprising a junction gate field-effect transistor (JFET); and the middle portion of the source includes a first concentration of the first dopant, the middle portion of the channel includes the first concentration of the first dopant, and the middle portion of the drain includes the first concentration of the first dopant.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An integrated circuit device comprising:
    a substrate;
    a first layer on the substrate, the first layer including a metal;
    a second layer on the first layer, the second layer including the metal;
    a switching device between the first and second layers, the switching device comprising a source, a channel, a drain, and a gate; and
    first, second, and third dielectric portions;
    wherein (a) a first vertical axis intersects the substrate, the first layer, the second layer, the source, the channel, and the drain; (b) the first dielectric portion surrounds the source in a first plane; (c) the second dielectric portion surrounds the channel in a second plane; (d) the third dielectric portion surrounds the drain in a third plane; (e) a second vertical axis intersects the first, second, and third dielectric portions; (f) the first, second, and third planes are orthogonal to the first vertical axis, (g) the source includes a first dopant, the first dielectric portion includes the first dopant, the second dielectric portion includes at least one of the first dopant and a second dopant, the drain includes the at least one of the first and second dopants, and the third dielectric portion includes the at least one of the first and second dopants, and (h) none of first, second, or third dielectric portions include a gate dielectric.

2. The integrated circuit device of claim 1 wherein:
    the first dielectric portion includes a first concentration of the first dopant;
    the second dielectric portion includes a second concentration of the at least one of the first and second dopants;
    the second concentration is greater than the first concentration.

3. The integrated circuit device of claim 1 wherein:
    the third dielectric portion includes a first concentration of the at least one of the first and second dopants;
    the second dielectric portion includes a second concentration of the at least one of the first and second dopants;
    the second concentration is greater than the first concentration.

4. The integrated circuit device of claim 1 wherein the switching device includes a pillar, the pillar comprising the source, the channel, and the drain.

5. The integrated circuit device of claim 1 wherein the first dielectric portion includes silicon and oxygen, the second dielectric portion includes silicon and oxygen, and the third dielectric portion includes silicon and oxygen.

6. The integrated circuit device of claim 1 wherein the second dielectric portion includes the first dopant, the drain includes the first dopant, and the third dielectric portion includes the first dopant.

7. The integrated circuit device of claim 1 wherein the second dielectric portion includes the second dopant, the drain includes the second dopant, the third dielectric portion includes the second dopant, the first dopant has a first polarity, and the second dopant has a second polarity opposite the first polarity.

8. The integrated circuit device of claim 1 wherein at least one of the first, second, and third dielectric portions includes a glass.

9. The integrated circuit device of claim 1 wherein at least one of the first, second, and third dielectric portions includes a spin-on-glass (SOG).

10. The integrated circuit device of claim 1 wherein:
    the first dielectric portion is included in a first dielectric layer;
    the second and third dielectric portions are included a second dielectric layer; and
    a seam exists where the first dielectric layer interfaces the second dielectric layer.

11. The integrated circuit device of claim 10 wherein the first and second dielectric layers are not monolithic with one another.

12. The integrated circuit device of claim 10 wherein an upper surface of the first dielectric layer directly contacts a lower surface of the gate.

13. The integrated circuit device of claim 1 wherein the switching device includes a thin film transistor (TFT).

14. The integrated circuit device of claim 1 wherein at least one of the first, second, and third dielectric portions includes air filled pores.

15. The integrated circuit device of claim 1 comprising: an additional switching device between the first and second layers, the additional switching device comprising: (a)(i) an additional source, an additional channel, an additional drain, and an additional gate; and (a)(ii) additional first, second, and third dielectric portions;

wherein (b) an additional first vertical axis intersects the substrate, the first layer, the second layer, the additional source, the additional channel, and the additional drain; (c) the additional first dielectric portion surrounds the additional source in the first plane; (d) the additional second dielectric portion surrounds the additional channel in the second plane; (e) the additional third dielectric portion surrounds the additional drain in the third plane; (f) an additional second vertical axis intersects the additional first, additional second, and additional third dielectric portions; and (g) the additional source includes the first dopant, the additional first dielectric portion includes the first dopant, the additional second dielectric portion includes the at least one of the first and second dopants, the additional drain includes the at least one of the first and second dopants, and the additional third dielectric portion includes the at least one of the first and second dopants.

16. The integrated circuit device of claim 15, wherein:
the first dielectric portion directly contacts the additional first dielectric portion;
the second dielectric portion directly contacts the additional second dielectric portion;
the third dielectric portion directly contacts the additional third dielectric portion.

17. The integrated circuit device of claim 1 wherein:
the first dielectric portion directly contacts the source;
the second dielectric portion directly contacts the gate; and
the third dielectric portion directly contacts the drain.

18. The integrated circuit device of claim 1 comprising a memory cell, wherein the switching device is an access transistor corresponding to the memory cell.

19. The integrated circuit device of claim 18 wherein:
at least one of the first and second layers includes a write line corresponding to the memory cell; and
at least another of the first and second layers includes a bit line corresponding to the memory cell.

20. A system comprising:
a memory; and
a processor coupled to the memory,
wherein at least one of the processor and the memory includes the integrated circuit device of claim 1.

21. A package comprising:
a package substrate;
a first die on the package substrate;
a second die on the package substrate;
wherein the first die includes:
an additional substrate;
a first layer on the additional substrate, the first layer include a metal;
a second layer on the first layer, the second layer including the metal;
a switching device on the additional substrate, the switching device comprising a source, a channel, a drain, and a gate;
first, second, and third dielectric portions;
wherein (a) a first vertical axis intersects the additional substrate, the first layer, the second layer, the source, the channel, and the drain; (b) the first dielectric portion directly contacts the source; (c) the second dielectric portion directly contacts the gate; (d) the third dielectric portion directly contacts the drain; (e) a second vertical axis intersects the first, second, and third dielectric portions; and (f) the source includes a dopant at a concentration, the drain substantially includes the dopant at the concentration, and the channel substantially includes the dopant at the concentration.

22. The package of claim 21 wherein:
the first dielectric portion includes silicon and oxygen, the second dielectric portion includes silicon and oxygen, and the third dielectric portion includes silicon and oxygen;
at least one of the first, second, and third dielectric portions includes a glass.

23. The package of claim 21 comprising at least one of (a) a stiffener coupled to the first die, and (b) a heat spreader coupled to the first die.

24. The package according to claim 21 wherein:
the first dielectric portion is included in a first dielectric layer;
the second and third dielectric portions are included a second dielectric layer; and
a seam exists where the first dielectric layer interfaces the second dielectric layer.

* * * * *